(12) United States Patent
Shah

(10) Patent No.: US 12,148,994 B1
(45) Date of Patent: Nov. 19, 2024

(54) RADIATION ABSORBER DEVICE

(71) Applicant: Tanvi Mitesh Shah, Irvine, CA (US)

(72) Inventor: Tanvi Mitesh Shah, Irvine, CA (US)

( * ) Notice: Subject to any disclaimer, the term of this patent is extended or adjusted under 35 U.S.C. 154(b) by 0 days.

(21) Appl. No.: 18/491,708

(22) Filed: Oct. 20, 2023

(51) Int. Cl.
  *H01Q 17/00* (2006.01)
  *H05K 9/00* (2006.01)

(52) U.S. Cl.
  CPC ........... *H01Q 17/00* (2013.01); *H05K 9/0007* (2013.01)

(58) Field of Classification Search
  CPC .............................. H01Q 17/00; H05K 9/0007
  USPC .................... 342/1, 12, 15, 20, 50, 175, 368
  See application file for complete search history.

(56) References Cited

U.S. PATENT DOCUMENTS

| | | | |
|---|---|---|---|
| 2012/0285737 A1 | 11/2012 | Judy et al. | |
| 2013/0206470 A1 | 8/2013 | Davis | |
| 2013/0257639 A1* | 10/2013 | Takahashi | H01Q 17/00 148/284 |
| 2014/0132440 A1* | 5/2014 | Hirose | H01Q 17/008 342/4 |
| 2015/0303583 A1* | 10/2015 | Takahashi | H01Q 17/00 342/1 |
| 2017/0256965 A1* | 9/2017 | Clark | H02J 7/0042 |

FOREIGN PATENT DOCUMENTS

| | | |
|---|---|---|
| IN | 202211054657 A | 9/2022 |
| WO | 2016131989 A1 | 8/2016 |

OTHER PUBLICATIONS

Behera et al., "Bioprospecting of cowdung microflora for sustainable agricultural, biotechnological and environmental applications," Current Research in Microbial Sciences vol. 2, Dec. 2021, 1-13.
Patent Cooperation Treaty, "International Search Report," date of mailing Mar. 1, 2024.
Patent Cooperation Treaty, Written Opinion of the International Searching Authority, date of mailing Mar. 1, 2024.

\* cited by examiner

*Primary Examiner* — Bo Fan
(74) *Attorney, Agent, or Firm* — CIONCA IP Law P.C.

(57) ABSTRACT

A radiation absorber device configured to protect a user from radiation from a wireless device, which has a housing made from radiation absorbent material, the housing having an opening, a first chamber and a second chamber, and wherein the first and second chambers are in communication with each other, the first chamber being greater than the second chamber, and wherein the first and second chambers are adapted to together receive a wireless device. The radiation absorber device also has a lid adapted to selectively close the opening of the housing and thus enclose the wireless device therein.

4 Claims, 5 Drawing Sheets

RADIATION ABSORBER DEVICE

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF INVENTION

1. Field of the Invention

The invention relates generally to devices or apparatuses and methods for protecting against radiation emitted by wireless devices and more particularly to apparatus and method for protecting against radiation emitted by wireless devices by using natural materials.

2. Description of the Related Art

Wireless devices, such as cell phones, are known to emit radiofrequency (RF) radiation causing headaches and other harm to users and surroundings. Scientists have found RF radiation to cause harm to trees and humans. For example, The International Agency for Research on Cancer (IARC) has classified RF radiation as a "possible human carcinogen."

Some people have experimented with radiation absorption by placing phones inside the cow dung piles. But that is messy and impractical for a typical wireless device user.

There are wireless chips made of cow dung and meda lakdi or other materials to be placed inside wireless cases. But that is ineffective and offer little protection against radiation because the wireless chips are typically thin and thus absorb little radiation and because they do not fully surround the wireless device.

Therefore, there is a need to solve the problems described above by providing an improved device and method for protecting against radiation emitted by wireless devices.

The aspects or the problems and the associated solutions presented in this section could be or could have been pursued; they are not necessarily approaches that have been previously conceived or pursued. Therefore, unless otherwise indicated, it should not be assumed that any of the approaches presented in this section qualify as prior art merely by virtue of their presence in this section of the application.

BRIEF INVENTION SUMMARY

This Summary is provided to introduce a selection of concepts in a simplified form that are further described below in the Detailed Description. This Summary is not intended to identify key aspects or essential aspects of the claimed subject matter. Moreover, this Summary is not intended for use as an aid in determining the scope of the claimed subject matter.

In an aspect, a radiation absorber device is provided, the radiation absorber device being a solid and dry structure having a housing and a lid, and being adapted to receive and enclose a wireless device, including its most radiant end, and thus reduce at least by $1/3$ (one third) the radiation from the wireless device that reaches a person positioned at 16 to 18 inches from the wireless device.

The above aspects or examples and advantages, as well as other aspects or examples and advantages, will become apparent from the ensuing description and accompanying drawings.

BRIEF DESCRIPTION OF THE DRAWINGS

For exemplification purposes, and not for limitation purposes, aspects, embodiments or examples of the invention are illustrated in the figures of the accompanying drawings, in which.

DETAILED DESCRIPTION

Figure 1A:
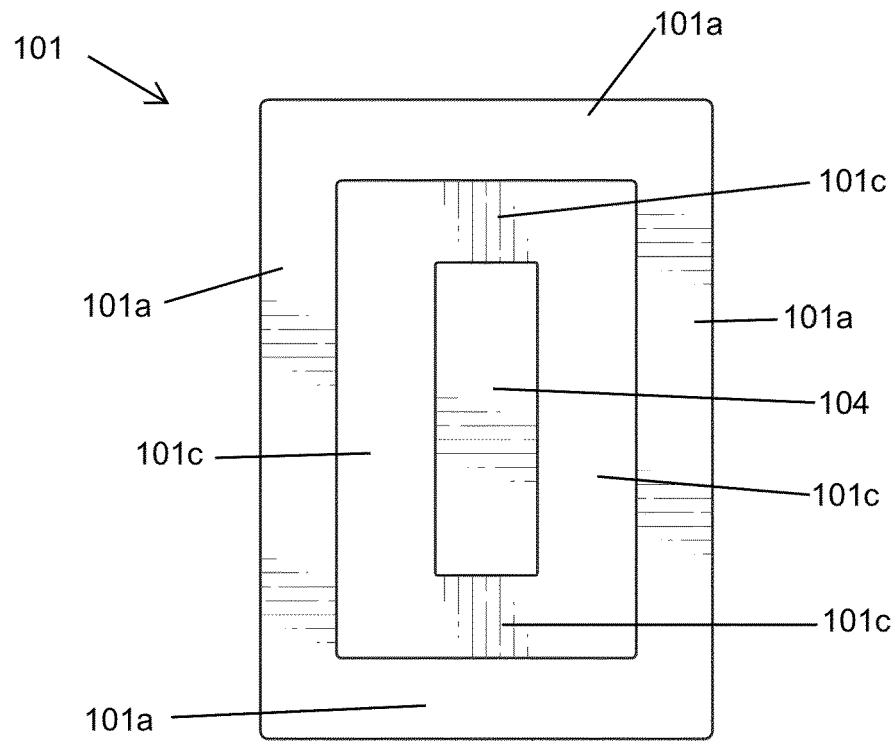
FIGS. 1A-B illustrates a top view of housing 201 from FIGS. 2A-B, respectively, when fully open, i.e., when the cap 202 is fully removed.

What follows is a description of various aspects, embodiments and/or examples in which the invention may be practiced. Reference will be made to the attached drawings, and the information included in the drawings is part of this detailed description. The aspects, embodiments and/or examples described herein are presented for exemplification purposes, and not for limitation purposes. It should be understood that structural and/or logical modifications could be made by someone of ordinary skills in the art without departing from the scope of the invention. Therefore, the scope of the invention is defined by the accompanying claims and their equivalents.

It should be understood that, for clarity of the drawings and of the specification, some or all details about some structural components or steps that are known in the art are not shown or described if they are not necessary for the invention to be understood by one of ordinary skills in the art.

For the following description, it can be assumed that most correspondingly labeled elements across the figures (e.g., 101 and 201, etc.) possess the same characteristics and are subject to the same structure and function. If there is a difference between correspondingly labeled elements that is not pointed out, and this difference results in a non-corresponding structure or function of an element for a particular embodiment, example or aspect, then the conflicting description given for that particular embodiment, example or aspect shall govern.

Figure 2A:
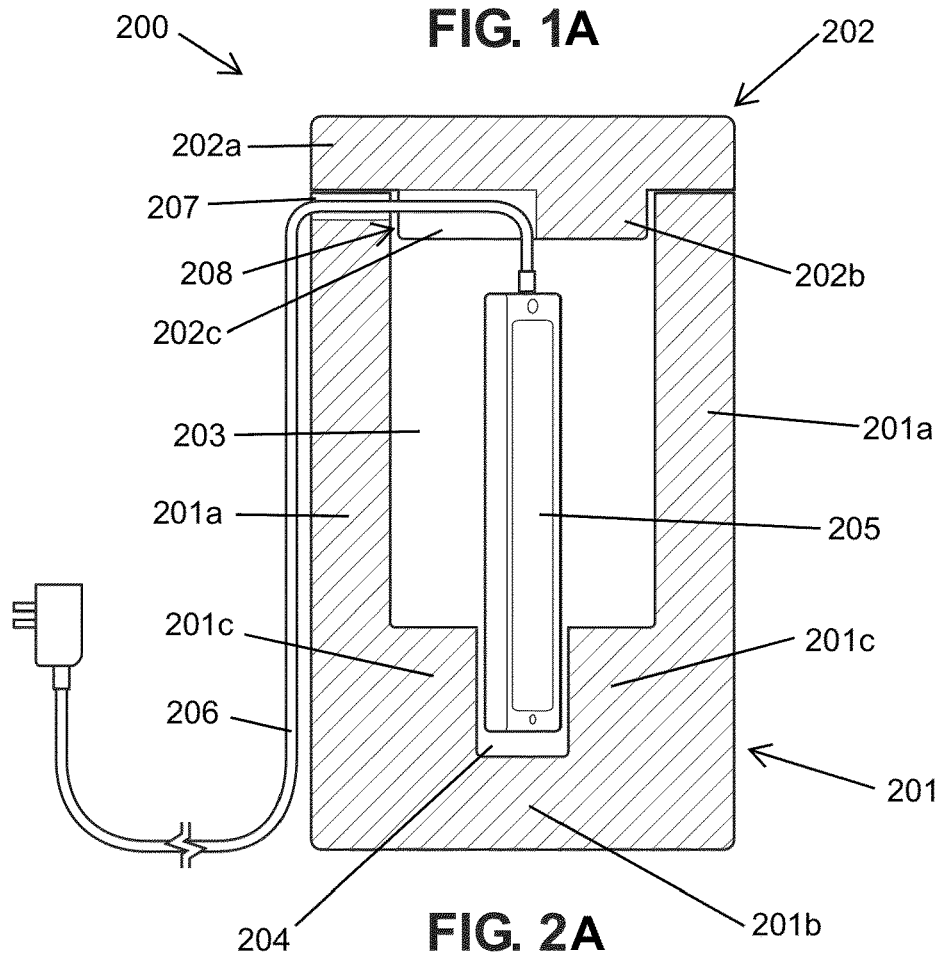
FIGS. 2A-B illustrate cross-sectional views of the disclosed radiation absorber device, according to several aspects.
Figure 1B:
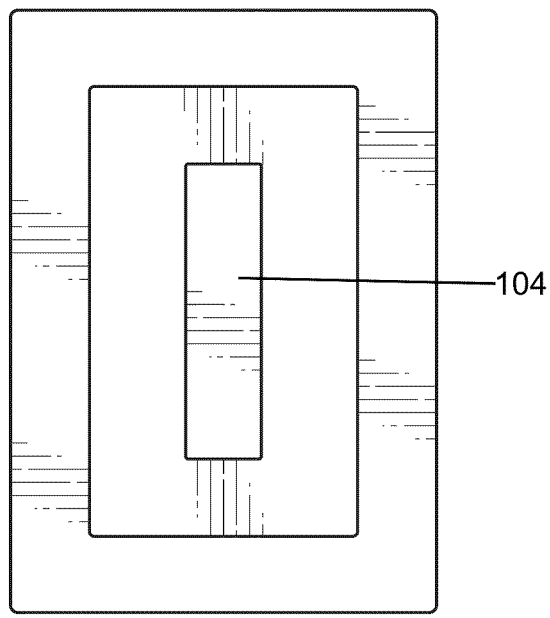
Figure 2B:
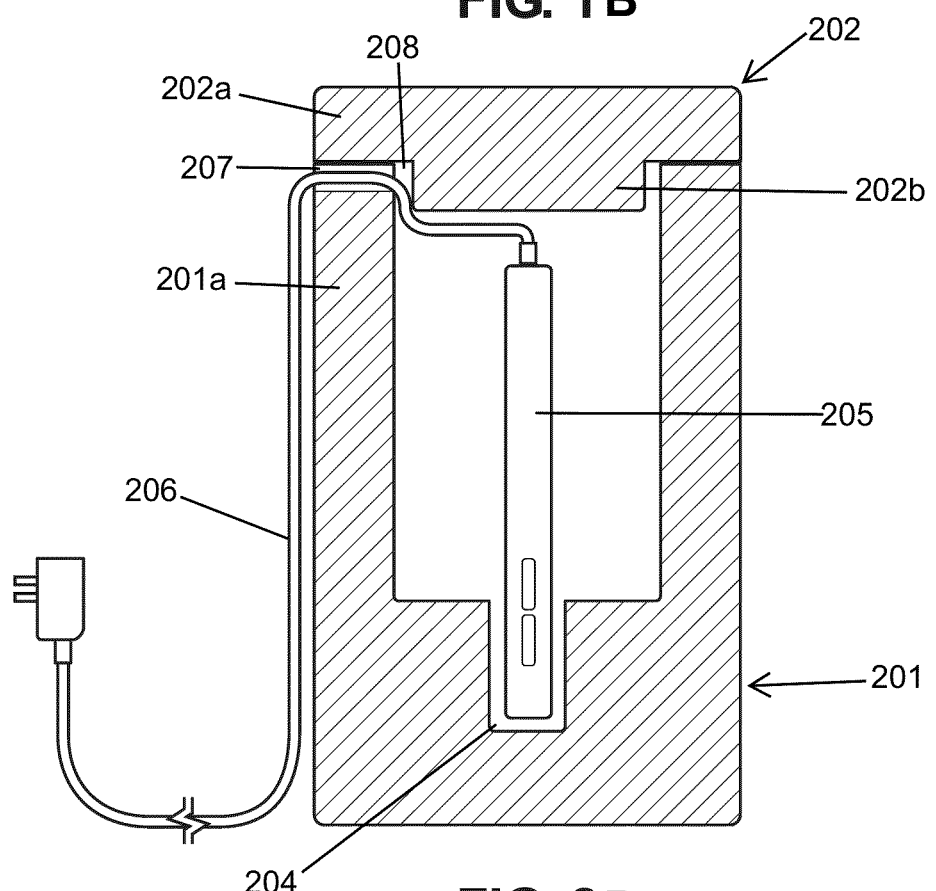

FIGS. 1A-B illustrates a top view of housing 201 from FIGS. 2A-B, respectively, when fully open, i.e., when the cap 202 is fully removed.

FIGS. 2A-B illustrate cross-sectional views of the disclosed radiation absorber device, according to several aspects. As shown, the radiation absorber device 200 includes a housing 201 and a cap 202. The housing 201 is formed by the walls 201a and a floor 201b such that to form a first chamber 203. As shown, in a preferred embodiment, the walls 201a are thicker in an area 201c near the floor 201b, such that to form a smaller second chamber 204. The second chamber 204 is configured to receive the end of wireless device 205 that is known to emit most radiation. The extra wall thickness in area 201c provides enhanced protection against radiation from the wireless device 205 escaping from the radiation absorber device 200.

In an example, the walls 201a can have a thickness of about 2 (two) inches and can have an additional thickness of about 2 (two) inches in area 201c. In an example, the thickness of floor 201b can be about 2 (two) inches. In an example, the height of the thicker wall area 201c can be about ⅓ (one third) of the height of the wireless device, but could be higher as well (e.g., ½), one objective being to allow the larger first chamber 203 to extend over enough height of the wireless device 205, such that to allow a user's fingers to comfortably insert and extract the wireless device 205 into and from the housing 201.

In an example, the second chamber 204 and can have a width that would comfortably accommodate the thickness of most wireless devices, such as 1 (one) inch, and a length that would accommodate the width of most wireless devices, such as 10 (ten) inches. In an example, the combined height of first and second chambers 203, 204 would accommodate the height of most wireless devices, such as 12 (twelve) inches. In another example, the size of the first and second chambers 203, 204, and implicitly the size of the radiation absorber device 200, can be specifically chosen to accommodate a particular wireless device, such as an iPhone or an iPad. Furthermore, the size of the first and second chambers 203, 204, and implicitly the size of the radiation absorber device 200, can be specifically chosen to accommodate more than one wireless device.

It should be noted that in the preferred embodiment depicted in FIGS. 1B and 2B the second chamber 104, 204 is slightly narrower to more closely follow the width of the wireless device 205.

In an example, as shown, the cap 202 includes a top plate 202a (402a in FIGS. 4A-B) and a protrusion 202b (402b in FIGS. 4A-B) extending from the top plate 202a into the first chamber 203. This configuration prevents the cap 202 from accidentally sliding off the top of the housing 201, such as during a slight tilt of the radiation absorber device 200. Further, as shown, the protrusion 202b increases the thickness of cap 202 and thus its capability of contributing to reducing radiation from the wireless device 205 from escaping outside the radiation absorber device 200. In a preferred embodiment, the protrusion 202b corresponds with the cross-sectional area of the first chamber 203, such that a maximum portion of cap 202 is thicker and thus more effective against radiation from wireless device 205. In an example, the top plate 202a of cap 202 may have a thickness of about 2 (two) inches and the protrusion 202b can have a thickness of about 0.5 to 1 (one) inch.

As shown in FIG. 2B, a channel 207 (407 in FIG. 4A) can be provided in a top edge of one of the walls 201a to allow a charging cord 206 (406 in FIG. 4A) to exit from first chamber 203, and thus allow the charging of the wireless device 205 while being enclosed in the radiation absorber device 200. It should be noted that channel 207 can be used also for the passage of any other cord or wire that needs to be connected to the wireless device 205, while the wireless device 205 is being used by user, such as when using a wired earphone connected to the wireless device 205 to make a phone call or listen to music. Preferably, the channel 207 has a cross-section that corresponds to the cross-section of the charging cord 206, to prevent radiation escaping through the channel 207. To facilitate the exit of charging cord 206, a cutout 202c (better seen in FIG. 4A as 402c) can optionally be provided in the protrusion 202b. However, preferably, the protrusion 202b is instead sized up such that to allow the charging cord 206 to reach channel 207 via a gap 208 between the protrusion 202b and the wall 201a, as better seen in FIG. 2A (see 208). In this preferred embodiment, the protrusion 202b has no cutout for the cord, and it is instead monolithic. as better seen in FIG. 4B. It should be understood that more than one channel 207 can be provided, such as two, when, for example, it is desired that two wireless devices be placed inside and charged or used (e.g., with a wired earphone) at the same time.

It should be understood that the wireless device 205 can be placed upright, as shown in FIG. 2B, or slanted, inside the radiation absorber device 200.

Figure 3:
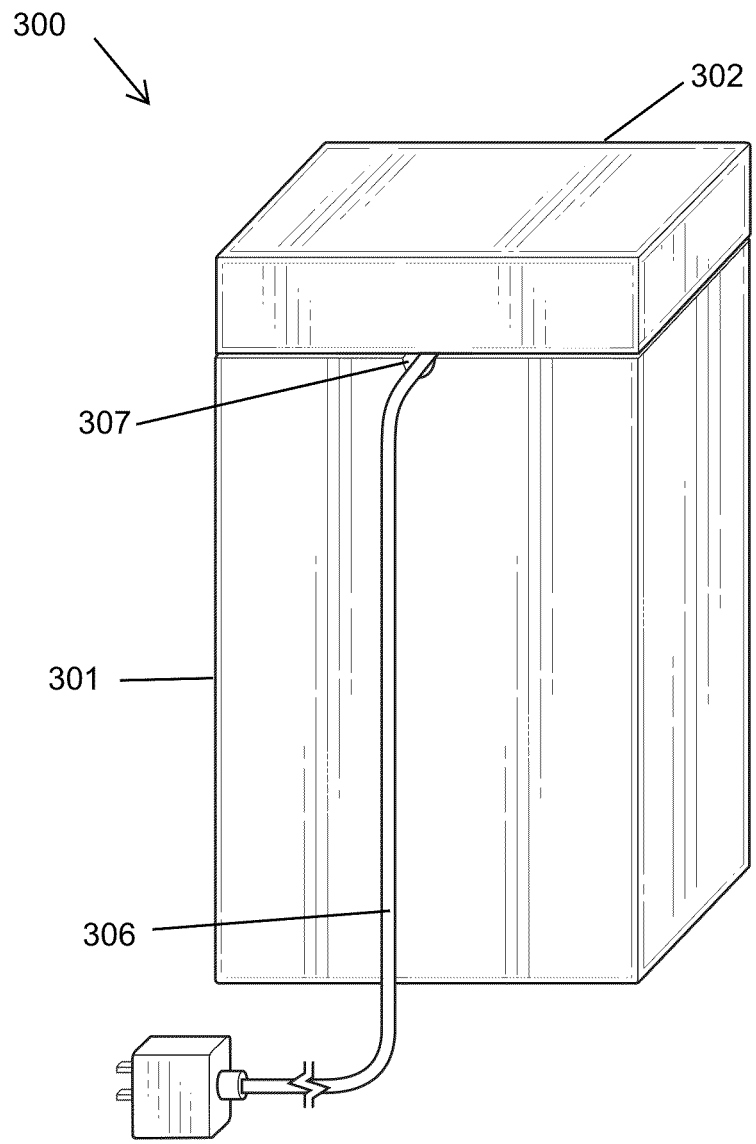
FIG. 3 illustrates a perspective view of a radiation absorber device while enclosing a wireless device.

FIG. 3 illustrates a perspective view of a radiation absorber device while enclosing a wireless device. As shown, with the wireless device (not shown) placed within the radiation absorber device 300, the cap 302 placed on top to close the housing 301 and the charging cord 306 exiting via channel 307, the wireless device is fully enclosed within the radiation absorber device 300, thus protecting person(s) nearby from radiation emitted by the wireless device, while, optionally, the wireless device can also be charged, or in use, such as to make a phone call or listening to music using a wired earphone. It should be noted that the disclosed radiation absorber device will likely be the most effective in protecting against radiation during the time of making calls, since it is then that most radiation will be emitted.

It should be noted that the rectangular shape of the radiation absorber device shown in the figures may be easier to manufacture, but it is otherwise optional. Other shapes may be employed.

Figure 4A:
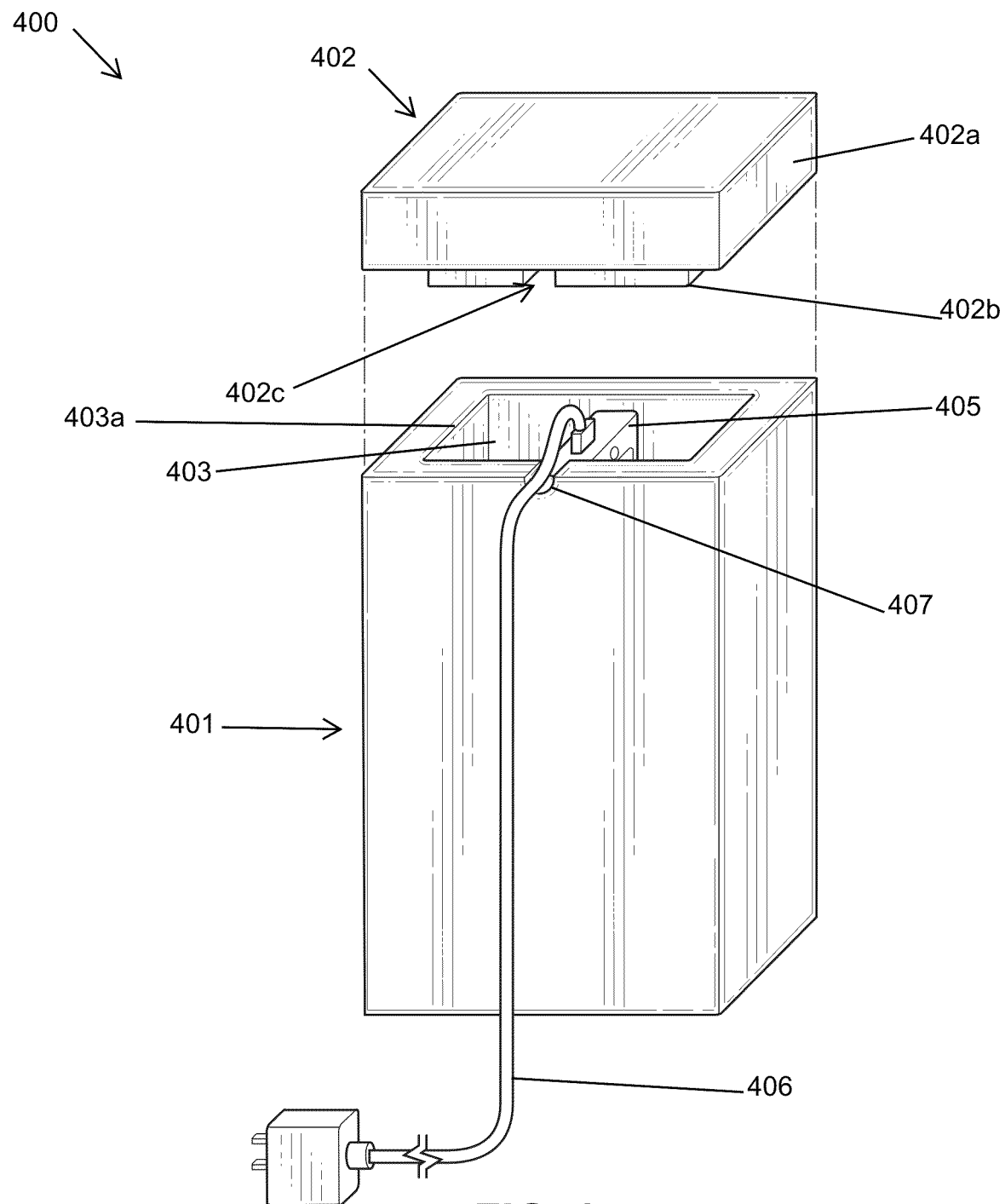
FIGS. 4A-B illustrate the perspective views of the radiation absorber device, with the cap 402 lifted above housing 401, so, details, such as the protrusion 402b can be seen.
Figure 4B:
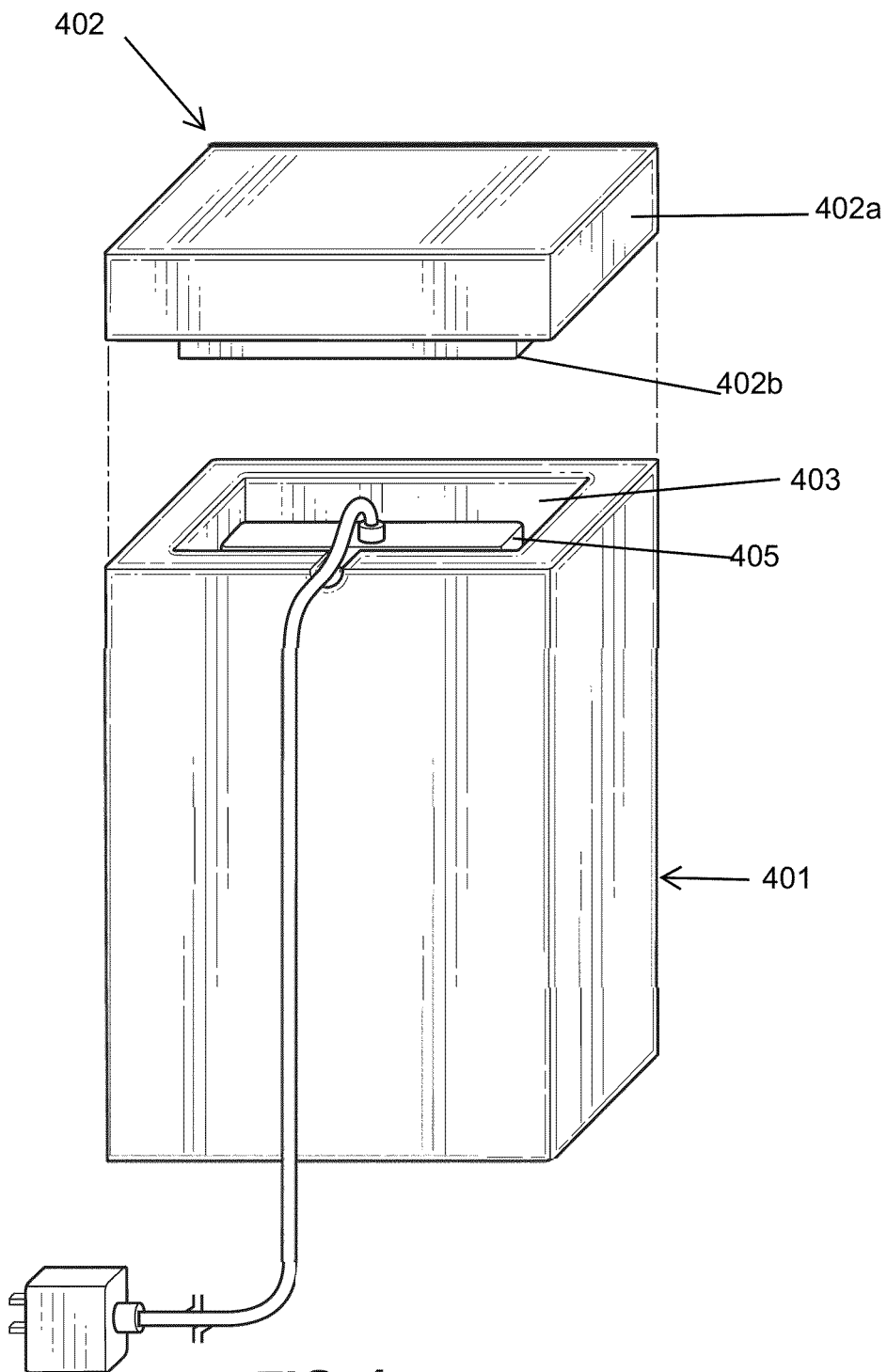

FIGS. 4A-B illustrate the perspective views of the radiation absorber device, with the cap 402 lifted above housing 401, so, details, such as the protrusion 402b can be seen. It should be noted that when a second chamber 204 is provided as preferred, the orientation of the wireless device 405 inside first chamber 403 would be as shown in FIG. 4B, such that to allow the insertion of the most radiant end of the wireless device 405 in the second chamber (204 in FIG. 2A-B). Again, by doing so, as described hereinbefore when referring to FIG. 2A-B, more radiation is prevented from escaping. It should be noted that in some wireless devices the most radiant end may be the end opposed to charging port, and thus that opposing end of the mobile device 205 will be placed in second chamber 204, as shown in FIGS. 2A-B and 4A-B. However, other wireless devices may have their most radiant end opposite the end having the charging port. In that case, it should be understood that, the wireless device 205 will be placed with the end having the charging port in the second chamber 204.

Again, as shown in FIG. 4B, in a preferred embodiment, the cap 402 has a monolithic protrusion 402b for enhanced absorption and thus protection from radiation.

It should be understood that the radiation absorber device 200, 300, 400 depicted in FIGS. 2A-4B is a preferred embodiment in that it is a two-piece structure, i.e., having the block or housing 201-401 with the cap 202-402 on, the cap 202-402 having a protrusion 202b, 402b to prevent sliding off and to help with better absorption of radiation.

In another embodiment, the cap 202-402 can be flat on the bottom surface, meaning that it would consist only of top plate 202a, 402a (no protrusion).

In an embodiment, individual walls can be used and secured together, such as by using adhesive, to form an enclosure/container-like, like the housing 201-401. In another embodiment, the housing 201-401 can be a monolithic structure produced using for example known manufacturing processes, such as casting or injection molding.

As described hereinbefore, in a preferred embodiment, housing opening 403a and first chamber 403 should be large enough to allow user to move hand in and out, to comfortably insert and remove the wireless device 405.

In a preferred embodiment the product is made from A2 pure breed cow dung and meda lakdi powder. The A2 pure breed cow dung is suitable for this application because of its antimicrobial and odorless (no stink) properties. The antimicrobial properties prevent the growth of microorganisms therein. The bark of the tree Indian Laurel or *Litsea glutinosa* is grinded to powder form to derive the meda lakdi powder. The cow dung has radiation absorbent properties and meda lakdi has binding properties, and thus helps keep the cow dung together in a desirable structure or shape, such as the housing and cap of the radiation absorber device disclosed herein. The meda lakdi powder is preferably fine powder, such as in flour, for enhanced binding properties.

In the dry cow dung—meda lakdi mixture, the meda lakdi powder may be used in an about 6% to 30% ratio by weight, while cow dung powder would be 70% to 94% ratio by weight. In an alternative embodiment, guar gum may be used instead of meda lakdi.

The radiation absorber device disclosed herein may be constructed in a rectangular shape, a square shape or any other suitable shape and its walls of the housing and its cap may have a thickness that is as low as 0.5 cm thickness and can be as big as 2 (two) inches or even greater, as desired, to achieve increased radiation protection. The thickness may be non uniform, such as for example it can be thicker at the bottom of the housing and thinner at the top of the housing and cap. Similarly, the product can have 2 (two) walls next to each other at varying heights to achieve different thickness, as shown in FIGS. 2A-B as an example, where the side walls are thicker at the bottom.

In an embodiment a glass window (not shown) may be provided for example in one of the side walls 201a to allow a user to see the screen of the wireless device 205 while placed inside the radiation absorber device 200.

Again, the shape and size of the radiation absorber device disclosed herein can be selected for example to be bigger or smaller, to accommodate the size of the targeted wireless device.

It was determined that the radiation absorber device disclosed herein absorbs at least ⅓ (one third) of the radiation from a wireless device enclosed in it, when a user is at about 16 inches to 18 inches away from the wireless device, making the wireless device and the radiation from it less harmful for the user.

Preferably, the radiation absorber device will be covered in a mesh, cotton, canvas or other fabric, or any suitable material to make it decorative or to make it a carrying device, such as a handbag, for the wireless device. A handle or belt can also be attached to make it easy for carrying this radiation absorber device. The covering can also have decorative embroidery, print, etc., to make it appealing.

Method of Use

In an example, a user could use the radiation absorber device 200 on a nightstand at night, while at sleep, and be protected from radiation emitted by the wireless device 205. Before going to sleep, the user will place the wireless device 205 inside the radiation absorber device 200, specifically with the most radiant end downwards and into the second chamber 204, as shown in FIG. 2. Next, if the user not only wants protection from radiation but also wants the wireless device 205 to be charged overnight, the user will pass the charging cord 206 through the channel 207 and then place the cap 202 on top, and thus enclose the wireless device 205 within radiation absorber device 200. Similarly, the wireless device 205 could be used, while being enclosed within the radiation absorber device 200 to listen to music via a wired earphone or to make phone calls via a wired headset, after for example dialing the number first and then inserting and enclosing the wireless device into the radiation absorber device 200.

Method of Manufacturing

In an example, dry cow dung cakes are pounded or ground into a powder. The cow dung powder is preferred to be coarse and not very fine, to retain its properties. Next, meda lakdi powder and water (hot water) is added to make it like a dough-like composition. Next, the dough is set to the desired shape such as by placing the dough in a mold, and then dehydrating it the dough, such as by placing it in the sun for 3-7 days. Sun drying is preferred as it helps preserve the antimicrobial properties of the A2 cow dung. It should be apparent that the drying period is dependent on the weather and sunlight.

In another example, meda lakdi powder may be mixed in fresh cow dung, and next, the resulting mixture can set into shape and then dried in natural sunlight.

The term "or" is inclusive, meaning and/or. The phrases "associated with" and "associated therewith." as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Further, as used in this application, "plurality" means two or more. A "set" of items may include one or more of such items. Whether in the written description or the claims, the terms "comprising." "including," "carrying," "having." "containing." "involving," and the like are to be understood to be open-ended, i.e., to mean including but not limited to. Only the transitional phrases "consisting of" and "consisting essentially of," respectively, are closed or semi-closed transitional phrases with respect to claims.

If present, use of ordinal terms such as "first," "second," "third," etc., in the claims to modify a claim element does not by itself connote any priority, precedence or order of one claim element over another or the temporal order in which acts of a method are performed. These terms are used merely as labels to distinguish one claim element having a certain name from another element having a same name (but for use of the ordinal term) to distinguish the claim elements. As used in this application, "and/or" means that the listed items are alternatives, but the alternatives also include any combination of the listed items.

Throughout this description, the aspects, embodiments or examples shown should be considered as exemplars, rather than limitations on the apparatus or procedures disclosed or claimed. Although some of the examples may involve specific combinations of method acts or system elements, it should be understood that those acts and those elements may be combined in other ways to accomplish the same objectives.

Acts, elements and features discussed only in connection with one aspect, embodiment or example are not intended to be excluded from a similar role(s) in other aspects, embodiments or examples.

Aspects, embodiments or examples of the invention may be described as processes, which are usually depicted using a flowchart, a flow diagram, a structure diagram, or a block diagram. Although a flowchart may depict the operations as a sequential process, many of the operations can be performed in parallel or concurrently. In addition, the order of the operations may be re-arranged. With regard to flowcharts, it should be understood that additional and fewer steps may be taken, and the steps as shown may be combined or further refined to achieve the described methods.

If means-plus-function limitations are recited in the claims, the means are not intended to be limited to the means disclosed in this application for performing the recited function, but are intended to cover in scope any equivalent means, known now or later developed, for performing the recited function.

If any presented, the claims directed to a method and/or process should not be limited to the performance of their steps in the order written, and one skilled in the art can readily appreciate that the sequences may be varied and still remain within the spirit and scope of the present invention.

Although aspects, embodiments and/or examples have been illustrated and described herein, someone of ordinary skills in the art will easily detect alternate of the same and/or equivalent variations, which may be capable of achieving the same results, and which may be substituted for the aspects, embodiments and/or examples illustrated and described herein, without departing from the scope of the invention. Therefore, the scope of this application is intended to cover such alternate aspects, embodiments and/or examples. Hence, the scope of the invention is defined by the accompanying claims and their equivalents. Further, each and every claim is incorporated as further disclosure into the specification.

What is claimed is:

1. A radiation absorber device comprising:
   a housing, the housing comprising:
      an opening, a top, and a bottom;
      a first chamber and a second chamber, the second chamber immediately disposed above a floor and between the first chamber and the bottom of the housing,
   wherein the first and second chambers are in communication with each other, wherein the housing is formed by walls and a floor such that to form the first chamber and the second chamber, wherein the walls are thicker in an area near the floor such that to form the second chamber, such that the first chamber's width is greater than the second chamber's width, and wherein the first and second chambers are adapted to together receive a wireless device; and
   a lid adapted to selectively close the opening of the housing;
   wherein the housing and the lid are made from a mixture comprising about 6% to 30% meda lakdi powder by weight and about 70% to 94% of cow dung powder by weight.

2. The radiation absorber device of claim 1, wherein the cow dung powder is A2 cow dung powder.

3. The radiation absorber device of claim 1, wherein the lid comprises a protrusion extending into the first chamber.

4. The radiation absorber device of claim 1, wherein the housing has a channel in a top edge of a wall of the housing, to allow a cord to exit the first chamber when the lid closes the opening of the housing.

\* \* \* \* \*